United States Patent [19]
Keller et al.

[11] Patent Number: 5,479,414
[45] Date of Patent: Dec. 26, 1995

[54] LOOK AHEAD PATTERN GENERATION AND SIMULATION INCLUDING SUPPORT FOR PARALLEL FAULT SIMULATION IN LSSD/VLSI LOGIC CIRCUIT TESTING

[75] Inventors: Paul N. Keller, Fishkill; Timothy J. Koprowski, Newburgh, both of N.Y.

[73] Assignee: International Business Machines Corporation, Armonk, N.Y.

[21] Appl. No.: 215,165

[22] Filed: Mar. 7, 1994

Related U.S. Application Data

[63] Continuation of Ser. No. 633,756, Dec. 26, 1990, abandoned.

[51] Int. Cl.$^6$ .................................................... G01R 31/28
[52] U.S. Cl. ............................................. 371/22.3; 371/27
[58] Field of Search .......................... 371/22.3, 27, 22.1, 371/23, 22.5, 22.4

[56] References Cited

PUBLICATIONS

Goel, "Lookahead Technique for Speeding up Fault Simulation for LSSD Logic Networks", IBM Tech. Disclosure Bulletin, vol. 21, No. 4 (Sep. 1978); pp. 1449–1450.

Hsiao, "Parallel Random Test Generation", IBM Technical Disclosure Bulletin, vol. 26, No. 2, Jul. 1983, pp. 775–776.

*Primary Examiner*—Hoa Nguyen
*Attorney, Agent, or Firm*—Whitham, Curtis, Whitham & McGinn; Charles W. Peterson, Jr.

[57] ABSTRACT

Algorithmically generated test patterns are structured for efficient test of "scan path" logic devices. A look ahead pattern generation and simulation scheme achieves a prespecified fault coverage. The fault simulation engine picks one of two paths at the end of each Tester Loop (TL) simulation: (1) restore to the state just prior to the current simulated Tester Loop and advance the pattern generators one state if an ineffective Tester Loop was found or (2) advance the pattern generators one state (from the end of the Tester Loop) if an effective Tester Loop was encountered. This basic technique can be modified to support parallel fault simulation by defining the pattern generator state at the start of the next tester loop (TL) state ($TL_{n+1}$) to be one state advanced from the pattern generator state at the START of $TL_n$. The pattern generator state for the start of all future TLs can be determined and parallel fault simulation is supported.

5 Claims, 7 Drawing Sheets

LOOK AHEAD PATTERN GENERATION AND SIMULATION INCLUDING SUPPORT FOR PARALLEL FAULT SIMULATION IN LSSD/VLSI LOGIC CIRCUIT TESTING

CROSS-REFERENCE TO RELATED APPLICATION

This application is a continuation of application Ser. No. 07/633,756 filed Dec. 26, 1990, now abandoned.

DESCRIPTION

Background of the Invention

1. Field of the Invention

The present invention generally relates to testing level sensitive scan design (LSSD) very large scale integrated (VLSI) logic circuit devices and, more particularly, to a technique for increasing the efficiency of test patterns applied to LSSD logic devices. The invention further provides support for parallel fault simulation and is applicable to all logic devices using some form of scan-based design.

2. Description of the Prior Art

When testing purely combinational logic devices (no memory elements, latches or arrays) a test pattern can generally be applied in one or several tester cycles. A test pattern is defined as the application of Boolean values to the Device Under Test (DUT) inputs (or Primary Inputs (PIs)) and comparing the DUT outputs (or Primary Outputs (POs)) to precalculated values. As latches are added to combinational logic, complicated feedback paths are introduced which greatly complicate automatic test pattern generation algorithms and potentially increase test complexity and consequently test time. Various "scan path" techniques, of which Level Sensitive Scan Design (LSSD) is a member, have been developed to combat this problem. These techniques cut all feedback paths, make memory elements easily accessible for testing, and add internal observation points which can be unloaded using a shift register.

Generally, the LSSD test methodology redefines a test pattern to include not only the application of data to DUT inputs and the measurement of DUT outputs but also the loading (scan in) of memory elements and the unloading (scan out) of internal observation points. These scan or shift registers (SRs) may be several hundred or thousand bits long in high density logic devices. These LSSD test patterns are also known as Tester Loops (TLs).

When testing regular structures (e.g., embedded arrays), Algorithmic Pattern Generators (APG) are used to generate the test patterns locally on the tester which are applied to the internal Shift Register Latches (SRLs) as well as to the Primary Inputs and Primary Outputs, providing significant data volume compression with negligible test time impact. The pattern application time is DUT (Shift Register Latch) dependent, while the pattern generation time is tester (APG algorithm) dependent. As long as the pattern generation time is much less than the pattern application time, test time impacts will be small. The APG takes at most several tester cycles to generate a test pattern, while the application of a pattern requires at least as many cycles as the longest DUT Shift Register (perhaps several hundred).

When testing custom logic, various hardware pattern generators have been developed which, like the hardware Algorithmic Pattern Generator, significantly reduce test pattern data volume when compared to Deterministic Stuck Fault (DSF) test methods. Current pattern generation schemes use mathematical models of the hardware pattern generator and DUT to simulate patterns to be applied. Patterns are simulated in a linear (and invariant) sequence until a predetermined fault coverage is achieved.

Most designs of custom logic hardware pattern generators provide one generator per DUT input, while outputs are compressed using signature analysis techniques. This implies that one generator must be shared by all the Shift Register Latches supported by a single Shift Register Input (SRI) pin. When scanning data into the DUT, this generator is advanced once for each SRL in the Shift Register. The number of generator states per Tester Loop is then equal to the number of SRLs in the Shift Register.

Unfortunately, these hardware pattern generators do not cover at least one new modeled fault with each Tester Loop applied. Consequently, many more patterns are required when algorithmically generated to achieve the required fault coverage as compared to DSF pattern generation.

In the past, logic chip test time has been driven largely by tester setup time and parametric test time; however, functional test time is becoming the most significant detractor to test system throughput. Functional test time can be divided into two major components. The first component is the actual time it takes to apply test patterns. The second component is the time it takes to transfer and manage the data containing the test patterns.

Hardware and software architectures have been devised and optimized in an attempt to minimize functional test time. Various local (on the tester) test pattern generation schemes now exist which significantly reduce the test program data volume for regular structures (embedded arrays) and custom logic. Although local pattern generation schemes address one aspect of test system cost (data volume), they potentially do so at the expense of other "cost" parameters, usually test system cost or throughput. When developing a test strategy, one must take into account the total cost of test which includes:

1. Test generation
2. Test data management and storage
3. Test system development
4. Test system cost
5. Test system maintenance
6. Floor space Given a specific amount of product to test, the throughput of a given tester determines the number of testers required. But since throughput is inversely proportional to logic chip test time and logic chip test time is, in turn, proportional to the number of patterns applied, a reduction in the number of test patterns results in a reduction in the number of testers required. With full function logic testers costing millions of dollars, it is therefore important to minimize the number of applied test patterns.

One method to reduce the number of applied test patterns is to skip the test patterns that do not cover any new modeled faults, thereby reducing test time. Previous proposals used the existing pattern generator sequence and attempted to skip each ineffective pattern by advancing the pattern generator to the state defined as the start of the next tester loop. Several techniques have been proposed, including the following:

1. Advance the pattern generator the appropriate number of times to achieve the next state, but at a rate faster than the pattern application rate. Unfortunately, the state of the art logic testers already operate at their maximum rate during pattern application, so increasing the rate is difficult and costly. Also, unless this rate is significantly faster than the pattern application rate, the test time saved by skipping a pattern is small.

2. Load the pattern generator with a locally pre-stored next tester loop state. This solution requires substantial amounts of memory and, therefore, increases tester cost and complexity.

3. Load the pattern generators with a hardware algorithmically generated next tester loop state. The hardware to implement this solution is also complex and expensive.

None of the foregoing proposals have been judged practical by the test community using technology currently available.

SUMMARY OF THE INVENTION

It is therefore an object of the present invention to provide a technique in which algorithmically generated test patterns are structured and applied to test "scan path" logic devices in a manner that allows for the skipping of ineffective test patterns with minimal hardware impact and minimal skipping overhead time.

It is a further object of the invention to have this technique support parallel fault simulation.

According to the invention, a Look Ahead Pattern Generation and Simulation (LAPGS) technique defines the pattern generator state at the start of the next tester loop ($TL_{n+1}$) to be one state advanced from the pattern generator state at the start of $TL_n$. The pattern generator state at the start of all tester loops is predetermined, and parallel fault simulation is supported.

What makes LAPGS so hardware efficient is that the pattern generators are no longer required to generate tester loop (TL) state sequences as defined by the existing pattern generation and simulation scheme. The new algorithm allows the hardware pattern generators to be efficiently designed, while the off-line pattern generation and simulation engine's pattern generation algorithm is altered.

These tester loop are simulated using a software model of the device to be tested, and the tester itself, until a predetermined fault coverage is achieved. Each tester loop is then marked as either effective or ineffective based on a predetermined criteria. Although the invention does not address the development of skip criteria, an example of one criteria is whether or not a new modeled fault has been detected.

The following procedure is followed within each tester loop during pattern application on the tester:

SAVE THE STATE OF THE PATTERN GENERATOR
  IF THE TESTER LOOP IS EFFECTIVE
    APPLY THE TESTER LOOP
    RESTORE THE PATTERN GENERATOR STATE
    ADVANCE THE PATTERN GENERATOR ONE STATE
  IF THE TESTER LOOP IS INEFFECTIVE
    ADVANCE THE PATTERN GENERATOR ONE STATE

The overhead to implement this "skipping" technique are save, restore and advance pattern generator state operations, which require only a few tester cycles as opposed to applying the ineffective pattern which is based on the depth of the scan chain (which may be hundreds or thousands of cycles).

It is important to note that the pattern generator data must first be processed through the data modifier logic, which is specifically configured for each individual latch within a scan chain, before being applied to the device under test (DUT). A buffer is used to store this "template" of configuration data for each latch in the scan chain. This "template" remains the same for many applications of tester loops.

The technique implemented by the invention requires a minor hardware modification to the existing logic test system architecture whereby a register (or other storage device) is added to each pattern generator and is used to save the state of the pattern generator at the start of each TL. This state is then restored at the end of the current TL and advanced once prior to executing the next TL. The restore/advance sequence between TLs does not depend on whether previous or future TLs are skipped. The pattern generator has already been advanced and is in the proper state for the next TL.

The combination of the new pattern generator state and the data modifier logic, in which the configuration remains unchanged per latch, effectively generates a new pattern to apply to the DUT, not simply the previous pattern generator state shifted by one.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
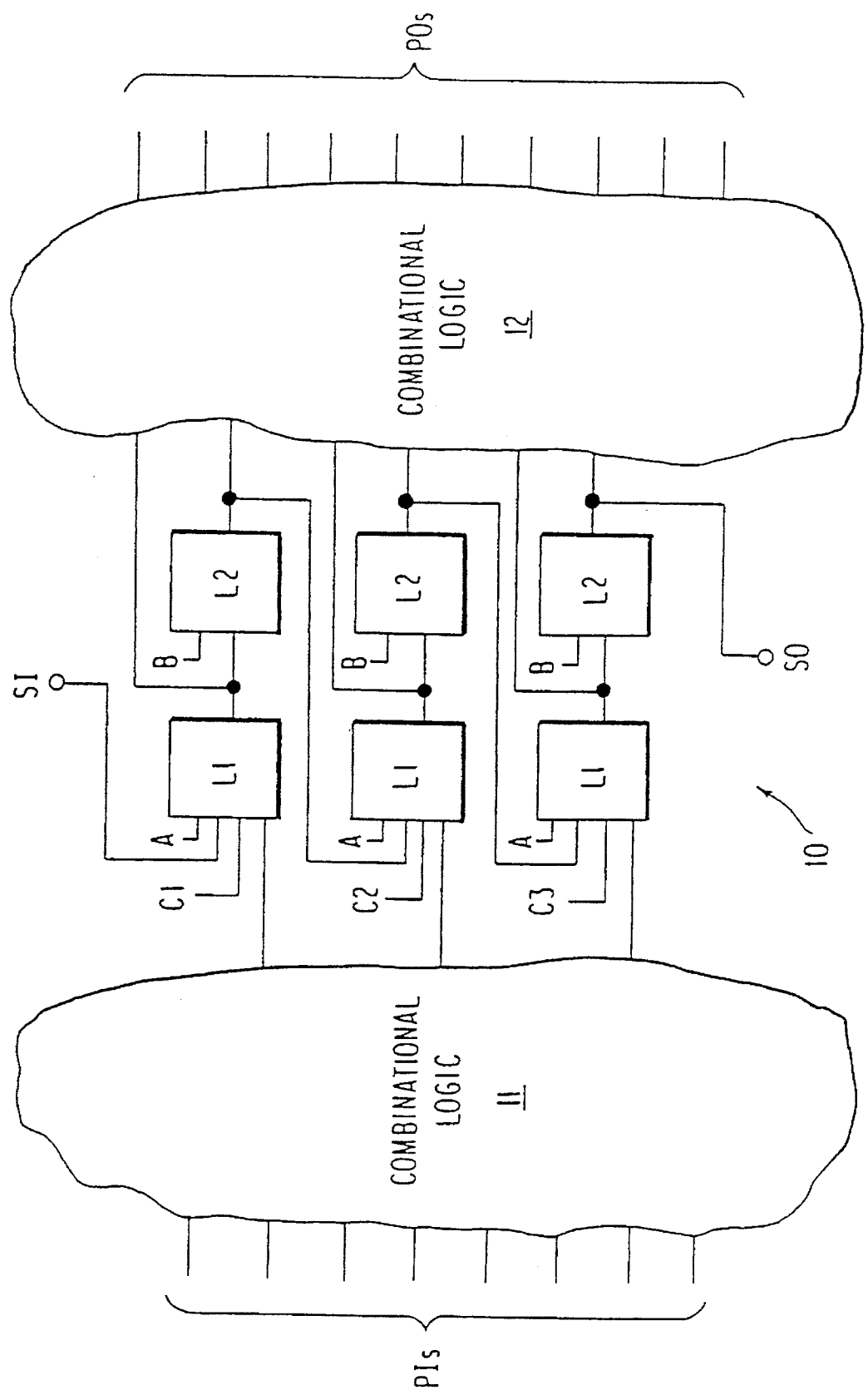
FIG. 1 is a block diagram of a general LSSD structure.

Referring now to the drawings, and more particularly to FIG. 1, there is shown a general LSSD structure 10. This structure is typical of a Device Under Test (DUT), as that term is used in this disclosure, and comprises a plurality of primary inputs (PIs) and a plurality of primary outputs (POs). The PIs are connected to combinational logic 11, while the POs are connected to combinational logic 12. The combinational logic 11 is connected to combinational logic 12 via paired latches L1, L2 that constitute one state of a scan-part shift register. More specifically, a paired L1-L2 constitutes a shift register latch (SRL) or one stage of a shift register. A and B are the test mode clocks used to control scanning, while $C_1$ to $C_n$ are system clocks used to control latching on normal data parts. SRI and SRO are, respectively, the device scan-in and scan-out parts.

Figure 2:
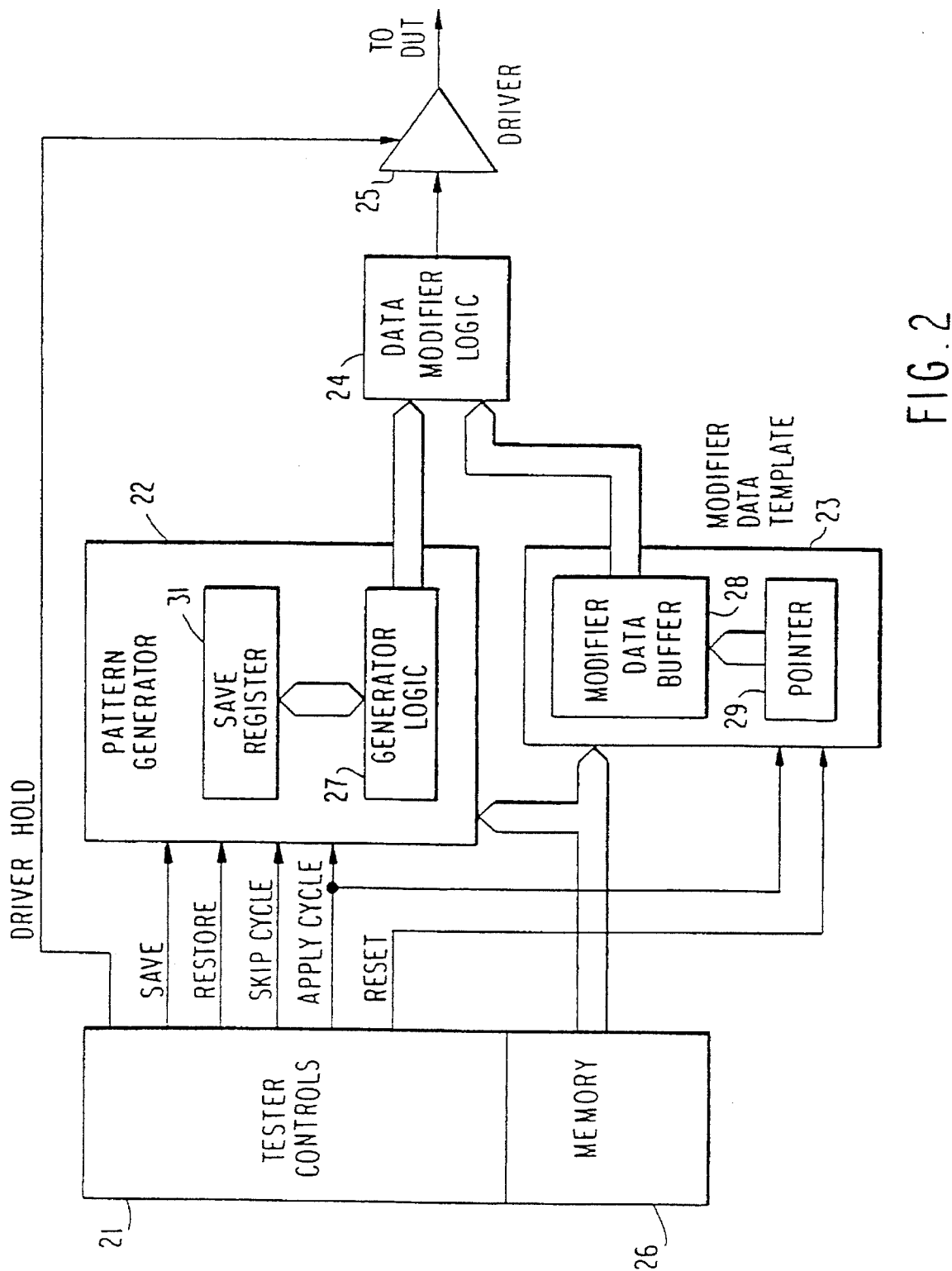
FIG. 2 is a block diagram of the hardware which supports the look ahead generation and simulation technique according to the invention.

FIG. 2 shows, in block diagram form, the hardware that supports the look ahead pattern generation and simulation according to the invention. The hardware is composed of four major parts: the tester control 21, the pattern generator 22, a modifier data template 23 and data modifier logic 24. The outputs of the data modifier logic are applied to a plurality of analog drivers, here represented by a single such driver 25, which apply the test patterns to the DUT. The tester controls 21 includes a memory 26 which contains test data that is supplied to initialize the generator logic 27 of the pattern generator 22 and load the modifier data buffer 28 of the modifier data template 23. The test pattern generated by generator logic 27 is supplied to the data modifier logic 24 where it is modified by data read out of the modifier data buffer under the control of a pointer (or address) in a pointer buffer 29 in the modifier data template. The pattern generator 22 also includes a save register 31 which is used for saving and restoring the pattern generator state.

Figure 3:
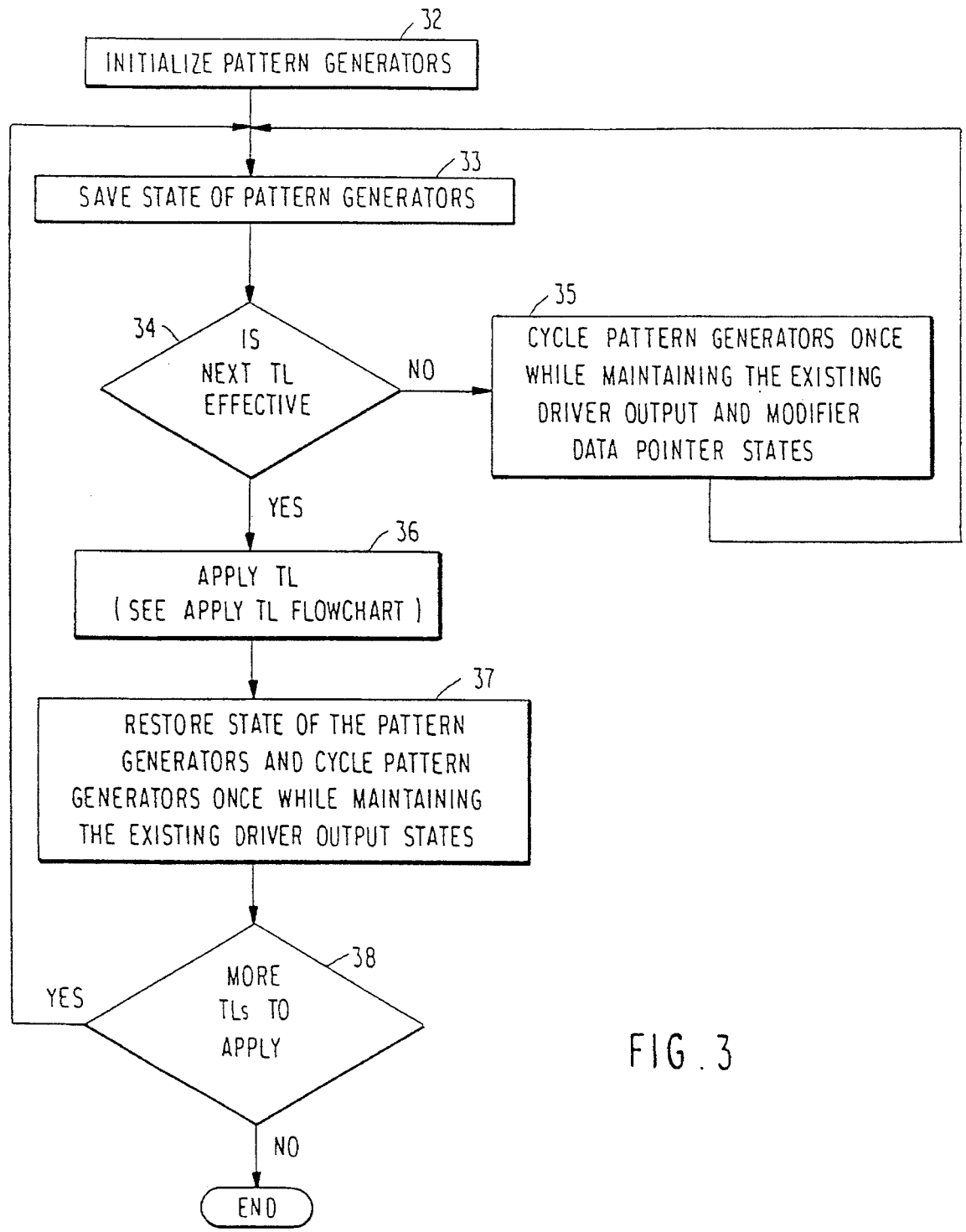
FIG. 3 is a flowchart which illustrates the operation of the hardware shown in FIG. 2.

The tester controls 21 control both the pattern generator 22 and the modifier data template 23 via the control paths shown in FIG. 2. The tester controls 21 also controls the state of the driver 25. The control commands are as follows:

1. Save pattern generator state in save register
2. Restore pattern generator state from save register
3. Cycle pattern generator, cycle modifier data pointer, driver enabled
4. Cycle pattern generator, hold modifier data pointer, hold driver state
5. Initialize pattern generator from tester memory
6. Initialize modifier data from tester memory
7. Reset modifier data pointer The operation of the hardware shown in FIG. 2 is illustrated by the flowchart of FIG. 3. The process begins in function block 32 where the tester controls 21 initializes the pattern generator 22. The state of the pattern generator is saved in the save register 31 of the pattern generator 22, as indicated by function block 33, and then a test is made in decision block 34 to determine if the next Tester Loop is effective. If not, the pattern generator 22 is cycled once in function block 35. The cycling of the pattern generator is done while maintaining the existing driver output and modifier data pointer states. The process then loops back to function block 33 where the state of the pattern generator is saved. Note that it is the test in decision block 34 which allows for the "skipping" of Tester Loops which would be ineffective.

Figure 4:
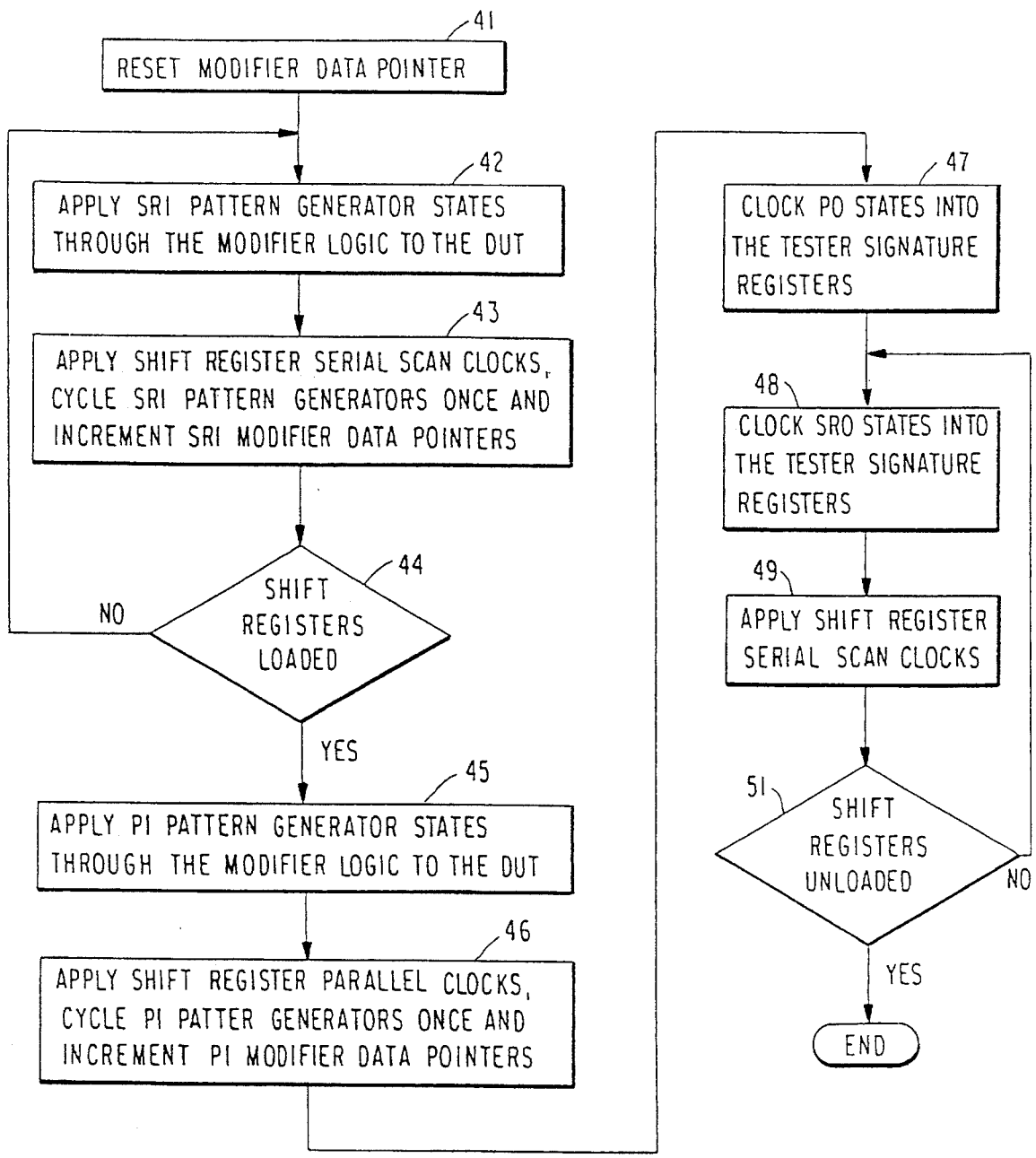
FIG. 4 is a flowchart of the Tester Loop logic which is called by the process illustrated in the flowchart of FIG. 3.

If the next Tester Loop is effective as determined in decision block 34, then a call is made in function block 36 to apply the Tester Loop. The apply Tester Loop flowchart is shown in FIG. 4 to which reference is now made. The process begins at function block 41 where the modifier data pointer buffer 29 is reset. Then, in function block 42, the shift register input (SRI) pattern generator states are applied to the DUT through the modifier logic 24. Next, in function block 43, the shift register serial scan clocks are applied to the DUT. The shift register input pattern generators are cycled once and the shift register input modifier data pointers are incremented. A test is made in decision block 44 to determine if the shift registers are loaded. If not, the process loops back to function block 42; otherwise, the primary input (PI) pattern generator states are applied to the DUT through the modifier logic 24 in function block 45. Next, the shift register parallel clocks are applied to the DUT in function block 46. The primary input pattern generators are cycled once and the primary input modifier data pointers are incremented.

At this point the primary output (PO) states are clocked into the tester signature registers, as indicated by function block 47. Next, in function block 48, the shift register output (SRO) states are clocked into the tester signature registers. Shift register serial scan clocks are applied to the DUT in function block 49 and, after each clock, a test is made in decision block 51 to determine if the shift registers are unloaded. If not, the process loops back to function block 48 and repeats until the shift registers are unloaded. When the shift registers are unloaded, a return is made to function block 36 in FIG. 3.

Returning again to FIG. 3, when the return is made from the apply Tester Loop process, the state of the pattern generators is restored in function block 37. The pattern generators are cycled once while maintaining the existing driver output states. A test is then made in decision block 38 to determine if there are more Tester Loops to apply. If so, the process loops back to function block 33 where, again, the state of the pattern generator is saved before the process continues. When there are no more Tester Loops to apply, the process ends.

Figure 5:
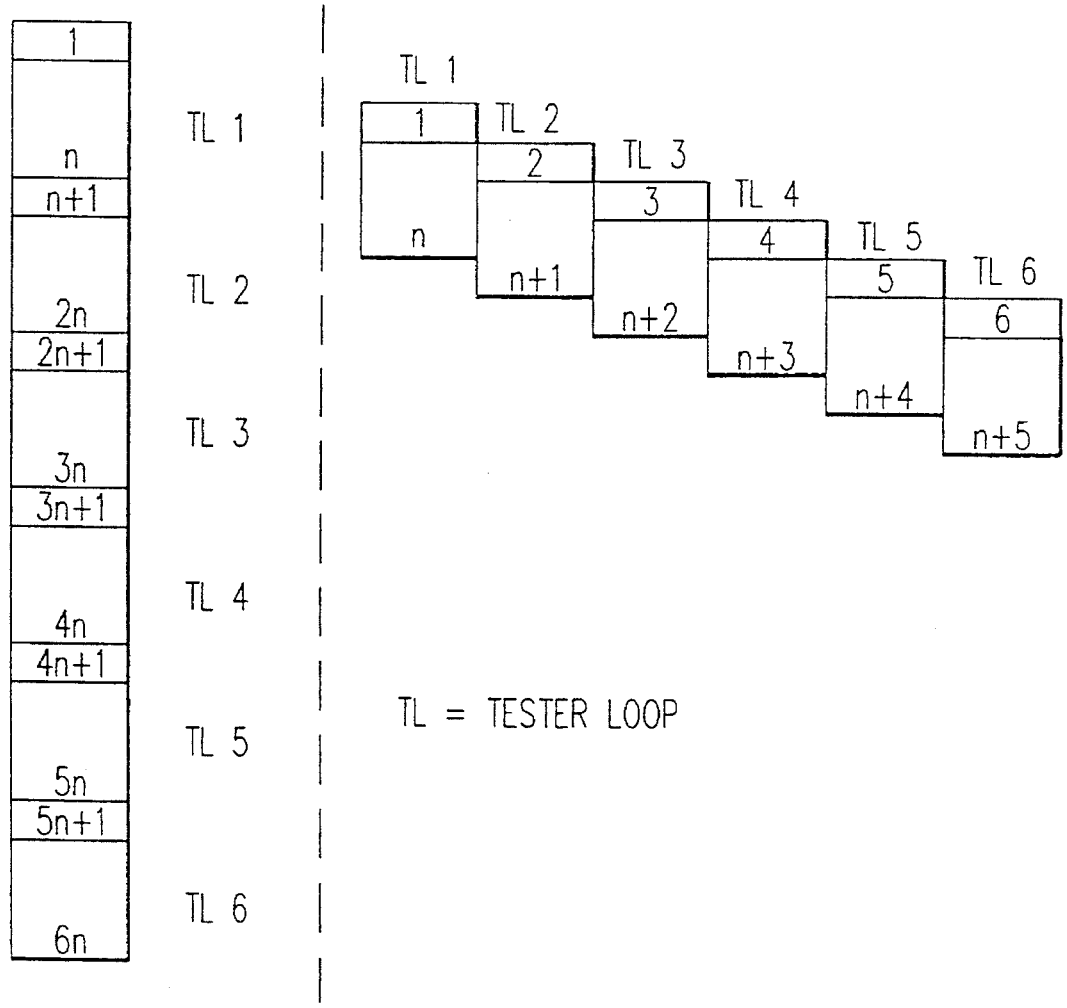
FIG. 5 is a diagram depicting the pattern generator states for the existing and LAPGS simulation and pattern application schemes.

FIG. 5 is a diagram depicting the pattern generator states for both the existing and LAPGS simulation and pattern application schemes. The existing scheme shows a pattern generator advancing in a sequential mode. As tester loops are encountered that require skipping, the pattern generator is advanced to the predetermined starting state of the next tester loop to support parallel fault simulation. As discussed previously, the skipping of n pattern generator states requires either significant test time or complex hardware.

The LAPGS scheme shows the pattern generator state at the start of the next tester loop as being one state advanced from the state at the start of the prior tester loop. Any tester loop can be skipped with no effect on the starting state of the pattern generators for any other tester loops, thereby supporting parallel simulation.

Figures 6, 7:
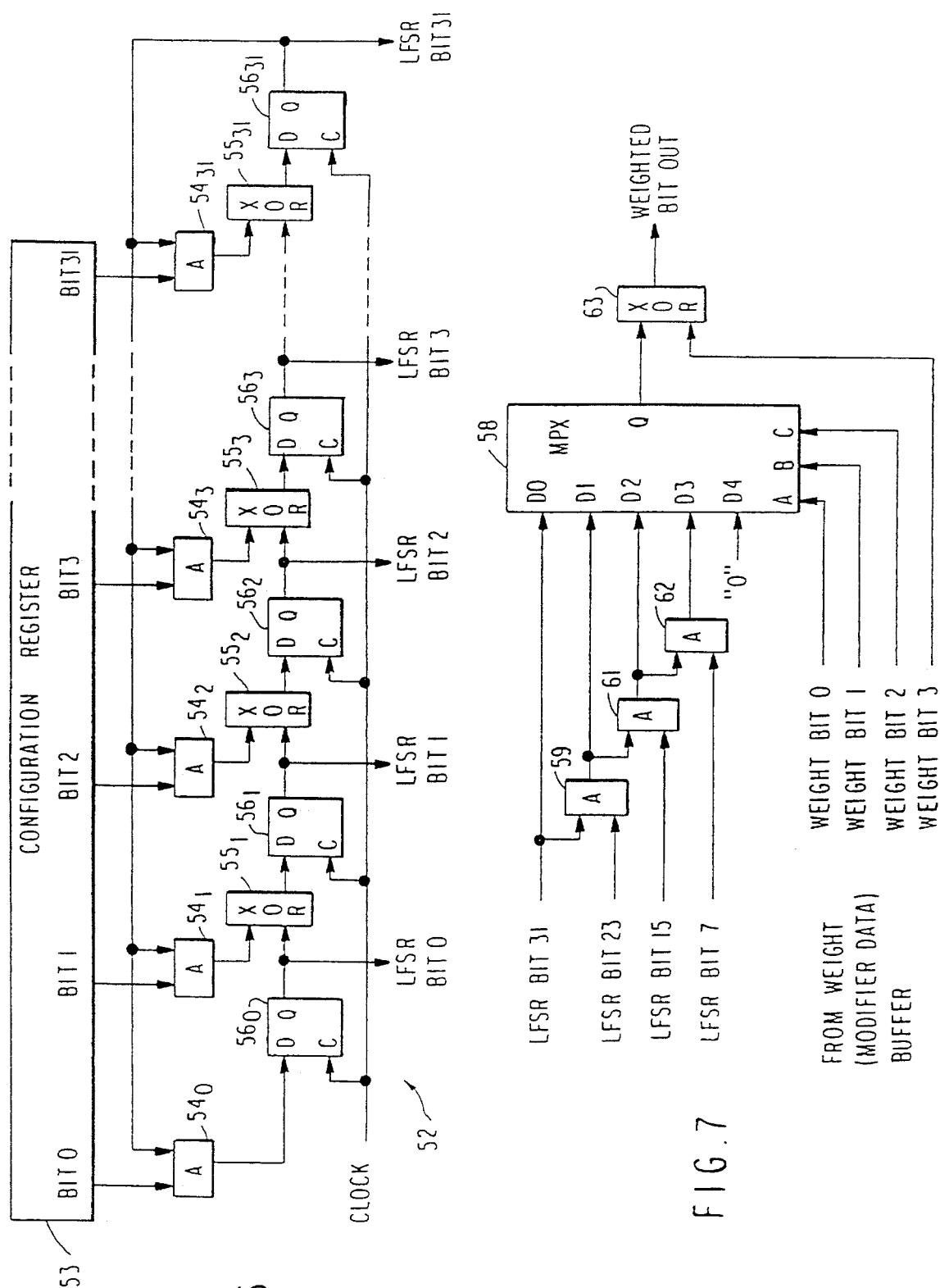
FIG. 6 is a block diagram showing an example of a pattern generator implemented as a linear feedback shift register.
FIG. 7 is a block diagram showing an example of data modifier logic.
Figure 8:
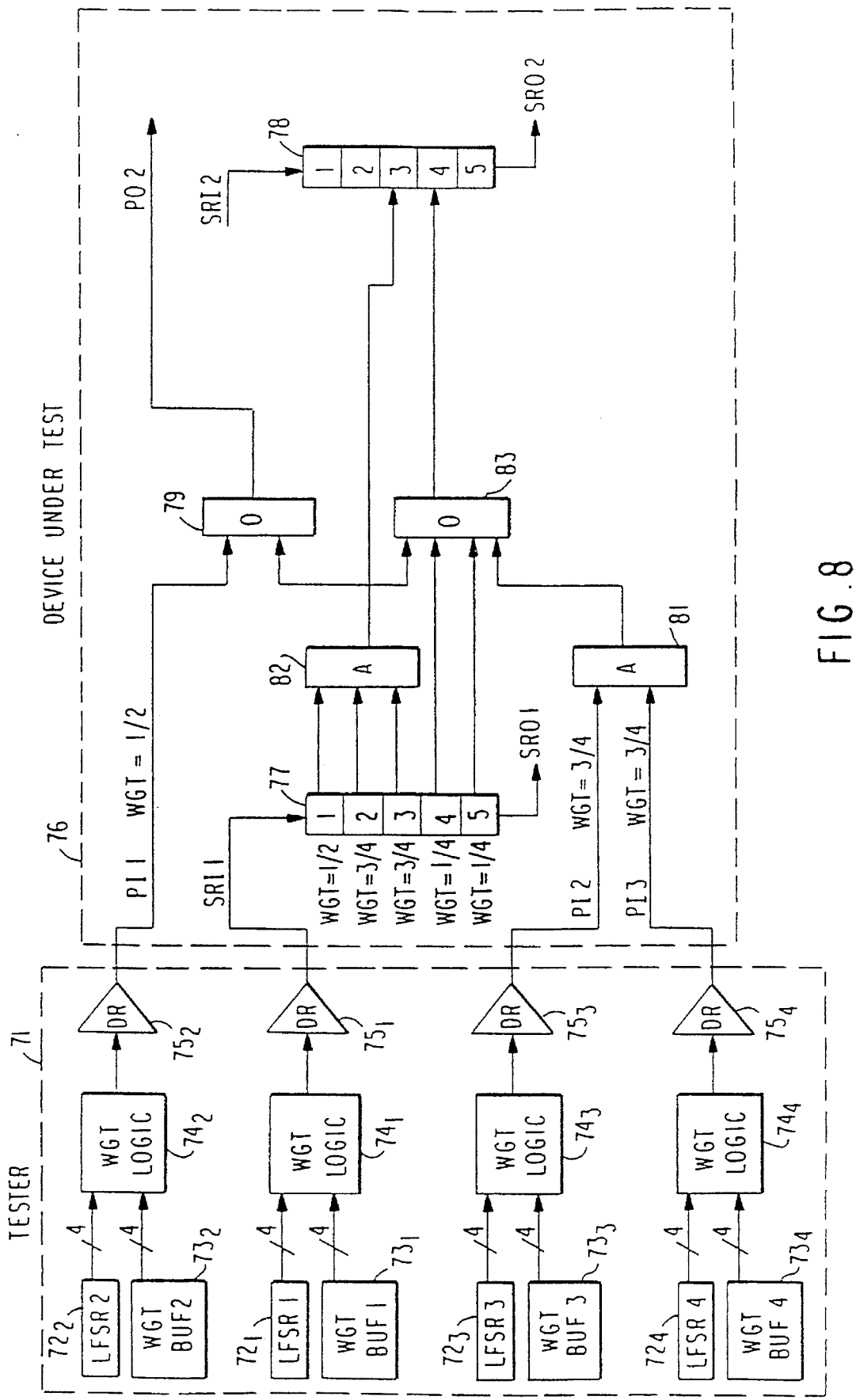
FIG. 8 is a block diagram showing an illustrative example of the test circuitry connected to a device under test.

FIGS. 6 through 8 illustrate a specific implementation of LAPGS using Weighted Random Pattern Test Generation. This application of LAPGS will now be described.

FIG. 6 shows a block diagram of a pattern generator 52 of a type which could be used in the generation logic 27. For a K-pin (K a positive integer) tester, there are K such pattern generators in the generation logic. The pattern generator 52 takes the form of a linear feedback shift register (LFSR) comprising a 32-bit configuration register 53 loaded from memory 26. The thirty-two bits in register 53 are supplied in parallel to AND gates $54_0$ to $54_{31}$. The outputs of AND gates $54_1$ to $54_{31}$ are respectively supplied as one input to Exclusive OR gates $55_1$ to $55_{31}$, while the output of AND gate $54_0$ is supplied to the data input of shift register stage $56_0$. The outputs of Exclusive OR gates $55_1$ to $55_{31}$ are respectively supplied to the data inputs of shift register stages $56_1$ to $56_{31}$. The second inputs to Exclusive OR gates $55_1$ to $55_{31}$ are respectively supplied by the outputs of shift register stages $56_0$ to $56_{30}$, while the output of shift register stage $56_{31}$ is supplied as the second inputs to each of AND gates $54_0$ to $54_{31}$. The linear feedback shift register outputs are taken from the shift register stages $56_0$ to $56_{31}$, each of these stages shifting under the control of the clock.

An example of the data modifier logic 24 is shown in more detail in the block diagram of FIG. 7. In this example, linear feedback shift register (LFSR) bits 7, 15, 23, and 31 from the example pattern generator 51 of the generator logic 26 are modified according to modifier data buffer 28. This specific example is commonly called "weight logic". More specifically, LFSR bit 31 is supplied to the $D_0$ input of a multiplexer 58 and one input of AND gate 59. LFSR bit 23 is supplied to the other input of AND gate 59. The output of AND gate 59 is, in turn, supplied to the $D_1$ input of multiplexer 58 and to one input of AND gate 61. LFSR bit 15 is supplied to the other input of AND gate 61. The output of AND gate 61 is, in turn, supplied to the $D_2$ input of multiplexer 58 and to one input of AND gate 62. LFSR bit 7 is supplied to the other input of AND gate 62, the output of which is supplied to the $D_3$ input of multiplexer 58. A binary "0" is supplied to the $D_4$ input of multiplexer 58.

One of the inputs $D_0$ to $D_4$ is selected by the weight bits 0 to 2 applied to the selector inputs A, B and C, respectively, of the multiplexer 58. The selected output from multiplexer 58 is supplied as one input to Exclusive OR gate 63, the other input of which is provided by the weight bit 3 from the modifier data buffer. The weighted bit output from Exclusive OR gate 63 is applied to a corresponding driver 25 which, when enabled by the tester controls 21, supplies the output to the DUT; otherwise, the output to the DUT is held at its previous state.

An illustrative example of the tester connected to a device under test as described thus far is shown in FIG. 8. This example is greatly simplified, and those skilled in the art will recognize that an actual device under test will be considerably more complex. The tester 71 is essentially the tester shown in FIG. 2 but in FIG. 8 is shown as comprising a plurality of linear feedback shift registers $72_1$ to $72_4$ which, as mentioned, comprise the pattern generator 22, a plurality of weighting buffers $73_1$ to $73_4$ which comprise the modifier data template 23, and a plurality of weighting logic circuits $74_1$ to $74_4$ which comprise the data modifier logic 24. The outputs of each of the logic circuits $74_1$ to $74_4$ are supplied by respective drivers $75_1$ to $75_4$ to the device under test (DUT) 76.

In the example shown, the output of driver $75_1$ is a first shift register input (SRI 1) supplied to shift register 77. A second shift register input (SRI 2) is supplied to shift register 78, although the generation of this input by tester 71 is not shown. As described with respect to FIG. 1, each of the stages of the shift registers 77 and 78 is comprised of an $L_1$-$L_2$ shift register latch pair. Not shown in FIG. 8 are the test mode clocks or the system clocks.

The outputs of drivers $75_2$ to $75_4$ constitute primary inputs one, two and three, respectively. The first of these (PI 1) is supplied to an OR gate 79, while the second and third of these (PI 2 and PI 3) are supplied to and AND gate 81. Within the DUT 76 the first three stages of shift register 77 are supplied to an AND gate 82, the output of which is supplied to OR gate 79, OR gate 83, and stage three of shift register 78. OR gate 83 also receives as inputs the outputs of stages four and five of shift register 77 and the output of AND gate 81. The output of OR gate 83 is supplied to stage four of shift register 78. The outputs of shift registers 77 and 78 constitute first and second shift register outputs (SRO 1 and SRO 2), respectively, from the DUT 76, while the output of OR gate 79 constitutes primary output two (PO 2), implying at least a first primary output (PO1), which is not shown in this example.

Note that each PI and latch within a scan chain has a weight value assigned to it. This weight forms the basis of the data modifier "template" and is used as input (weight bits) to the data modifier logic as shown in FIG. 7. The correlation between the weight value and corresponding weight bits is shown in the Weight Table below.

| WEIGHT TABLE | | | | |
|---|---|---|---|---|
| Weight | Corresponding Weight Bits | | | |
| Value | 3 | 2 | 1 | 0 |
| ½ | 0 | 0 | 0 | 0 |
| ¼ | 0 | 0 | 0 | 1 |
| ⅛ | 0 | 0 | 1 | 0 |
| 1/16 | 0 | 0 | 1 | 1 |
| 0 | 0 | 1 | 0 | 0 |
| ¾ | 1 | 0 | 0 | 1 |
| ⅞ | 1 | 0 | 1 | 0 |
| 15/16 | 1 | 0 | 1 | 1 |
| 1 | 1 | 1 | 0 | 0 |

This weight data remains the same for many applications of tester loops.

The following is an example of data applied with both the existing data application scheme and the LAPGS data application technique using the example circuitry shown in FIGS. 6, 7 and 8.

EXAMPLE

Existing Data Application vs. LAPGS

Pattern Generator—32-bit LFSR (FIGS. 6 and 8)
Data Modifier Logic—Weight Logic (FIGS. 7 and 8)
Modifier Data Buffer—Weight Buffer (FIG. 8)

| Data Application (Refer to FIG. 8) | | |
|---|---|---|
| | Configuration Data | Seed Data |
| $LFSR_1 \rightarrow SRI_1$ | BA9AC3A8 | 166E7B7C |
| $LFSR_2 \rightarrow PI_1$ | 8EFAA268 | 595D362D |
| $LFSR_3 \rightarrow PI_2$ | EB681E68 | A15AACD0 |
| $LFSR_4 \rightarrow PI_3$ | BDA59168 | ED23535B |

| Data Applied to DUT with Existing Sequential Operation | | | | | |
|---|---|---|---|---|---|
| | Weight | $TL_1$ | $TL_2$ | $TL_3$ | $TL_4$ | $TL_5$ |
| $SR_1$, Bit 1 | ½ | 1 | 1 | 0 | 1 | 1 |
| $SR_1$, Bit 2 | ¾ | 1 | 0 | 1 | 1 | 1 |
| $SR_1$, Bit 3 | ¾ | 1 | 0 | 1 | 1 | 1 |
| $SR_1$, Bit 4 | ¼ | 0 | 0 | 0 | 0 | 0 |
| $SR_1$, Bit 5 | ¼ | 0 | 1 | 0 | 0 | 0 |
| $PI_1$ | ½ | 1 | 0 | 1 | 1 | 1 |
| $PI_2$ | ¾ | 1 | 1 | 1 | 1 | 1 |
| $PI_3$ | ¾ | 0 | 1 | 1 | 1 | 1 |

| Data Applied to DUT with LAPGS Implementation | | | | | |
|---|---|---|---|---|---|
| | Weight | $TL_1$ | $TL_2$ | $TL_3$ | $TL_4$ | $TL_5$ |
| $SR_1$, Bit 1 | ½ | 1 | 1 | 0 | 1 | 1 |
| $SR_1$, Bit 2 | ¾ | 1 | 0 | 0 | 1 | 0 |
| $SR_1$, Bit 3 | ¾ | 1 | 1 | 0 | 0 | 1 |
| $SR_1$, Bit 4 | ¼ | 0 | 0 | 0 | 1 | 1 |
| $SR_1$, Bit 5 | ¼ | 0 | 0 | 0 | 0 | 1 |
| $PI_1$. | ½ | 1 | 0 | 1 | 1 | 1 |

-continued

Data Applied to DUT with LAPGS Implementation

|     | Weight | TL$_1$ | TL$_2$ | TL$_3$ | TL$_4$ | TL$_5$ |
| --- | --- | --- | --- | --- | --- | --- |
| PI$_2$ | ¾ | 1 | 1 | 1 | 1 | 1 |
| PI$_3$ | ¾ | 0 | 1 | 1 | 1 | 1 |

The configuration register (53 in FIG. 6) of each LFSR (72$_1$, 72$_2$, 72$_3$, and 72$_4$ in FIG. 8) is loaded with the configuration data while the shift register (56$_0$ to 56$_{31}$ in FIG. 6) of each LFSR is loaded with the seed data. For each tester loop, LFSR$_1$ (72$_1$ in FIG. 8) is cycled five times, while LFSR$_2$ (72$_2$ in FIG. 8), LFSR$_3$ (72$_3$ in FIG. 8), and LFSR$_4$ (72$_4$ in FIG. 8) are cycled once. The contents of the DUT shift register (77 in FIG. 8) and PIs are shown after each of five tester loop applications for both the existing and LAPGS schemes. Note that the applied shift register data is different between the two schemes and the LAPGS generated data is not simply the existing pattern data shifted in time. New patterns have been generated and applied with the LAPGS technique.

While the invention has been described in terms of a single preferred embodiment, those skilled in the art will recognize that the invention can be practiced with modification within the spirit and scope of the appended claims.

We claim:

1. A look ahead pattern generation and simulation method performed by a tester apparatus which includes a pattern generator that generates VLSI "scan path" test patterns, known as "tester loops", said method comprising the steps of:

simulating a test of a device under test by said tester apparatus by using a plurality of tester loops generated by said pattern generator, to provide results of said step of simulating;

analyzing said results of said step of simulating to determine which tester loops are effective and which tester loops are ineffective to provide a meaningful test result output;

marking each of said plurality of said tester loops as effective or ineffective based on said analyzing step;

loading marked tester loops into said tester apparatus, said marked tester loops being for test pattern application on the device under test;

for each tester loop of said plurality of tester loops loaded into the tester apparatus, saving a current state of the pattern generator in a register;

prior to applying a tester loop of said plurality of tester loops to the device under test, checking the tester loop to determine if the tester loop is marked as effective or ineffective;

if the tester loop is marked as effective, applying the tester loop from the pattern generator to the device under test, restoring the current pattern generator state by reading a saved current state stored in said register, and advancing the pattern generator one state; but if the tester loop is marked as ineffective, advancing the pattern generator one state to skip the tester loop, thereby increasing throughput of the tester apparatus.

2. The method recited in claim 1 wherein said step of advancing said pattern generator one state to skip the tester loop is performed by making the starting state of said pattern generator prior to a tester loop application to a device under test independent of previous tester loop being applied or skipped.

3. A method for fault testing very large scale integrated logic circuit chips with a testing machine, comprising the steps of:

creating a software simulated circuit model of an integrated circuit chip to be tested, said integrated circuit chip having primary inputs and primary outputs;

calculating said primary outputs of said software simulated circuit model for a plurality of test loop patterns to be applied to said primary inputs;

analyzing said primary outputs for each of said plurality of test loop patterns to be applied to said primary inputs to determine if said each test loop pattern is effective by identifying a fault path in said integrated circuit chip; and applying only those test loop patterns determined as being effective in said determining step to said integrated circuit chip using said testing machine to thereby complete fault testing of said integrated circuit chip.

4. A method as recited in claim 3, further comprising the steps of:

loading one of said test loop patterns determined as being effective into a test generator logic circuit in said testing machine;

saving said loaded one test loop pattern from said test generator logic circuit in a save register;

forwarding said test loop pattern from said save register to said test generator logic circuit if said test loop pattern is determined as being effective from said determining step;

skipping said test loop pattern in said save register if said test loop pattern was not determined as being effective in said determining step; and loading a next test loop pattern from said plurality of test loop patterns into said save register.

5. A method as recited in claim 4, further comprising the step of applying an output from said generator logic circuit to said integrated circuit chip.

* * * * *